(12) United States Patent
Bangsaruntip et al.

(10) Patent No.: US 8,536,563 B2
(45) Date of Patent: Sep. 17, 2013

(54) NANOWIRE FIELD EFFECT TRANSISTORS

(75) Inventors: Sarunya Bangsaruntip, Mount Kisco, NY (US); Guy M. Cohen, Mohegan Lake, NY (US); Shreesh Narasimha, Beacon, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 320 days.

(21) Appl. No.: 12/884,707

(22) Filed: Sep. 17, 2010

(65) Prior Publication Data

US 2012/0068150 A1 Mar. 22, 2012

(51) Int. Cl.
 *H01L 29/06* (2006.01)
(52) U.S. Cl.
 USPC ............ 257/9; 257/E21.409; 438/151
(58) Field of Classification Search
 USPC .......... 257/161, 151, 142, 157, 366; 438/9, 438/E21.151, E21.119, E21.409, E29.245
 See application file for complete search history.

(56) References Cited

U.S. PATENT DOCUMENTS

| | | |
|---|---|---|
| 4,995,001 A | 2/1991 | Dawson et al. |
| 5,308,445 A | 5/1994 | Takasu |
| 5,438,018 A | 8/1995 | Mori et al. |
| 5,552,622 A | 9/1996 | Kimura |
| 5,574,308 A | 11/1996 | Mori et al. |
| 5,668,046 A | 9/1997 | Koh et al. |
| 6,365,465 B1 | 4/2002 | Chan et al. |
| 6,642,115 B1 | 11/2003 | Cohen et al. |
| 6,653,209 B1 | 11/2003 | Yamagata |
| 6,806,141 B2 | 10/2004 | Kamins |
| 6,835,618 B1 | 12/2004 | Dakshina-Murthy et al. |
| 6,855,606 B2 | 2/2005 | Chen et al. |

(Continued)

FOREIGN PATENT DOCUMENTS

| | | |
|---|---|---|
| EP | 217811 A1 | 4/2010 |
| KR | 20090044799 A | 5/2009 |

(Continued)

OTHER PUBLICATIONS

A. J. Gates, "Designing a Nanoelectronic Circuit to Control a Millimeter-scale Walking Robot," Mitre Technical Paper, Nov. 2004, http://www.mitre.org/work/tech_papers/tech_papers_04/04_1248/04_1248.pdf.

(Continued)

*Primary Examiner* — Julio J Maldonado
*Assistant Examiner* — Robert Bachner
(74) *Attorney, Agent, or Firm* — Cantor Colburn LLP; Vazken Alexanian

(57) ABSTRACT

A method for forming a nanowire field effect transistor (FET) device including forming a first silicon on insulator (SOI) pad region, a second SOI pad region, a third SOI pad region, a first SOI portion connecting the first SOI pad region to the second SOI pad region, and a second SOI portion connecting the second SOI pad region to the third SOI pad region on a substrate, patterning a first hardmask layer over the second SOI portion, forming a first suspended nanowire over the semiconductor substrate, forming a first gate structure around a portion of the first suspended nanowire, patterning a second hardmask layer over the first gate structure and the first suspended nanowire, removing the first hardmask layer, forming a second suspended nanowire over the semiconductor substrate, forming a second gate structure around a portion of the second suspended nanowire, and removing the second hardmask layer.

3 Claims, 18 Drawing Sheets

(56) References Cited

U.S. PATENT DOCUMENTS

| | | | |
|---|---|---|---|
| 6,882,051 | B2 | 4/2005 | Majumdar et al. |
| 6,891,227 | B2 | 5/2005 | Appenzeller et al. |
| 6,903,013 | B2 | 6/2005 | Chan et al. |
| 6,996,147 | B2 | 2/2006 | Majumdar et al. |
| 7,101,762 | B2 | 9/2006 | Cohen et al. |
| 7,151,209 | B2 | 12/2006 | Empedocles et al. |
| 7,180,107 | B2 | 2/2007 | Appenzeller et al. |
| 7,211,853 | B2 | 5/2007 | Bachtold et al. |
| 7,253,060 | B2 | 8/2007 | Yun et al. |
| 7,297,615 | B2 | 11/2007 | Cho et al. |
| 7,311,776 | B2 | 12/2007 | Lin et al. |
| 7,443,025 | B2 | 10/2008 | Verbist |
| 7,446,025 | B2 | 11/2008 | Cohen et al. |
| 7,449,373 | B2 | 11/2008 | Doyle et al. |
| 7,452,759 | B2 | 11/2008 | Sandhu |
| 7,452,778 | B2 | 11/2008 | Chen et al. |
| 7,456,068 | B2 | 11/2008 | Kavalieros et al. |
| 7,456,476 | B2 | 11/2008 | Hareland et al. |
| 7,473,943 | B2 | 1/2009 | Mostarshed et al. |
| 7,498,211 | B2 | 3/2009 | Ban et al. |
| 7,550,333 | B2 | 6/2009 | Shah et al. |
| 7,569,941 | B2 | 8/2009 | Majumdar et al. |
| 7,642,578 | B2 | 1/2010 | Lee et al. |
| 7,791,144 | B2 | 9/2010 | Chidambarrao et al. |
| 7,799,657 | B2 | 9/2010 | Dao |
| 7,803,675 | B2 | 9/2010 | Suk et al. |
| 7,834,345 | B2 | 11/2010 | Bhuwalka et al. |
| 7,871,870 | B2 | 1/2011 | Mostarshed et al. |
| 7,893,506 | B2 | 2/2011 | Chau et al. |
| 8,097,515 | B2 | 1/2012 | Bangsaruntip et al. |
| 8,154,127 | B1 | 4/2012 | Kamins et al. |
| 8,338,280 | B2 | 12/2012 | Tan et al. |
| 2004/0149978 | A1 | 8/2004 | Snider |
| 2004/0166642 | A1 | 8/2004 | Chen et al. |
| 2005/0121706 | A1 | 6/2005 | Chen et al. |
| 2005/0266645 | A1 | 12/2005 | Park |
| 2005/0275010 | A1 | 12/2005 | Chen et al. |
| 2006/0033145 | A1 | 2/2006 | Kakoschke et al. |
| 2006/0138552 | A1 | 6/2006 | Brask et al. |
| 2006/0197164 | A1 | 9/2006 | Lindert et al. |
| 2007/0001219 | A1 | 1/2007 | Radosavljevic et al. |
| 2007/0267619 | A1 | 11/2007 | Nirschl |
| 2007/0267703 | A1 | 11/2007 | Chong et al. |
| 2007/0284613 | A1 | 12/2007 | Chui et al. |
| 2008/0014689 | A1 | 1/2008 | Cleavelin et al. |
| 2008/0061284 | A1 | 3/2008 | Chu et al. |
| 2008/0067495 | A1 | 3/2008 | Verhulst |
| 2008/0067607 | A1 | 3/2008 | Verhulst et al. |
| 2008/0079041 | A1 | 4/2008 | Suk et al. |
| 2008/0085587 | A1* | 4/2008 | Wells et al. ............ 438/455 |
| 2008/0121932 | A1 | 5/2008 | Ranade |
| 2008/0128760 | A1 | 6/2008 | Jun et al. |
| 2008/0135949 | A1 | 6/2008 | Lo et al. |
| 2008/0142853 | A1 | 6/2008 | Orlowski |
| 2008/0149914 | A1 | 6/2008 | Samuelson et al. |
| 2008/0149997 | A1 | 6/2008 | Jin et al. |
| 2008/0150025 | A1 | 6/2008 | Jain |
| 2008/0179752 | A1 | 7/2008 | Yamauchi et al. |
| 2008/0191196 | A1 | 8/2008 | Lu et al. |
| 2008/0224224 | A1 | 9/2008 | Vandenderghe et al. |
| 2008/0227259 | A1 | 9/2008 | Avouris et al. |
| 2008/0246021 | A1 | 10/2008 | Suk et al. |
| 2008/0247226 | A1 | 10/2008 | Liu et al. |
| 2008/0290418 | A1 | 11/2008 | Kalburge |
| 2009/0026553 | A1 | 1/2009 | Bhuwalka et al. |
| 2009/0057650 | A1 | 3/2009 | Lieber et al. |
| 2009/0057762 | A1 | 3/2009 | Bangsaruntip et al. |
| 2009/0061568 | A1 | 3/2009 | Bangsaruntip et al. |
| 2009/0090934 | A1 | 4/2009 | Tezuka et al. |
| 2009/0134467 | A1 | 5/2009 | Ishida et al. |
| 2009/0149012 | A1 | 6/2009 | Brask et al. |
| 2009/0181477 | A1 | 7/2009 | King et al. |
| 2009/0217216 | A1 | 8/2009 | Lee et al. |
| 2009/0294864 | A1 | 12/2009 | Suk et al. |
| 2010/0140589 | A1 | 6/2010 | Ionescu |
| 2010/0193770 | A1* | 8/2010 | Bangsaruntip et al. ........ 257/24 |
| 2010/0207102 | A1 | 8/2010 | Lee et al. |
| 2011/0133169 | A1* | 6/2011 | Bangsaruntip et al. ........ 257/38 |
| 2011/0147840 | A1 | 6/2011 | Cea et al. |
| 2012/0146000 | A1 | 6/2012 | Bangsaruntip et al. |
| 2013/0001517 | A1 | 1/2013 | Bangsaruntip et al. |

FOREIGN PATENT DOCUMENTS

| | | |
|---|---|---|
| WO | 02084757 A1 | 10/2002 |
| WO | W02008069765 A1 | 6/2008 |
| WO | WO2008069765 A1 | 6/2008 |

OTHER PUBLICATIONS

Androitis, et al, Realistic nanotube-metal contact configuration for molecular electronics applications, IEEE Sensors Journal, vol. 8, No. 6, Jun. 2008.

R. Bahar, "Trends and Future Directions in Nano Structure Based Computing and Fabrication," Copyright 2006 IEEE, International Conf. on Computer Design (ICCD), Oct. 1-4, 2007, pp. 522-527.

Buddharaju, et al., "Gate-All-Around Si-Nanowire CMOS Inverter Logic Fabricated Using Top-Down Approach," European Solid-State Device Research Conference, Sep. 11-13, 2007, pp. 303-306.

Chen, et al., "Demonstration of Tunneling FETs Based on Highly Scalable Verticle Silicon Nanowires," IEEE Electron Device Letters, vol. 30, No. 7, Jul. 2009, pp. 754-756.

Ernst, et al., "3D Multichannels and Stacked Nanowires Technologies for New Design Opportunities in Nanoelectronics," IEEE International Conference on Integrated Circuit Design and Technology and Tutorial, 2008. ICICDT 2008. Jun. 2-4, 2008 pp. 265-268.

Hu, et al., "Fringing field effects on electrical resistivity of semiconductor nanowire-metal contacts," Published online Feb. 27, 2008, Copyright 2008 American Institute of Physics, Applied Physics Letters 92, 083503 2008.

J. Xiang, et al., "Ge/Si Nanowire Heterostructures as High-Performance Field-Effect Transistors," Nature 441, 489-493, May 25, 2006.

Knoch, et al., "Tunneling phenomena in carbon nanotube field-effect transistors," Phys Stat Sol. (a) 205, No. 4, 679-694, 2008, published online Mar. 17, 2008.

Leonard, et al., "Size-dependent effects on electrical contacts to nanotubes and nanowires," Phys Rev Lett, Jul. 14, 2006; 97(2):026804.

M. M. Ziegler, et al., "The CMOS/NANO Interface from a Circuits Perspective," ISCAS '03. Proceedings of the 2003 International Symposium on Circuits and Systems, 2003, May 25-28, 2003, vol. 4, pp. IV-904-IV-907.

M. T. Bjork, et al., "Silicon Nanowire Tunneling Field-Effect Transistors," Applied Physics Letters 92, 193504, 2008; published online May 13, 2008.

Ma, et al., "High-performance nanowire complementary metal-semiconductor inverters," Applied Physics Letters 93, 053105, 2008, published online Aug. 6, 2008.

S. R. Mehrotra, "A Simulation Study of Silicom Nanowire Field Effect Transistors (FETs)," University of Cincinnati, Jul. 2007.

Lauhon, et al., "Epitaxial core-shell and core-multishell nanowire heterostructures," Nature, vol. 420, Nov. 7, 2002, pp. 57-61.

Singh, et al, "Si, SiGe Nanowire Devices by Top-Down Technology and Their Applications," IEEE Transactions on Electron Devices, vol. 55, No. 11, Nov. 2008, pp. 3107-3118.

T. Su, et al., "New Planar Self-Aligned Double-Gate Fully Depleted P-MOSFET's Using Epitaxial Lateral Overgrowth (ELO) and Selectively Grown Source/Drain (S/D)," Copyright 2000 IEEE, 2000 IEEE International SOI Conference, Oct. 2000.

N. Checka, "Circuit Architecture for 3D Integration," Chapter 13 in Wafer Level 3-D ICs Process Technology, ed. C.S. Tan, Springer US, 2008, ISBN 978-0-387-76534-1.

International Search Report; International Application No. PCT/US2011/029304; International Filing Date: Mar. 22, 2011; Date of Mailing: May 20, 2011.

International Search Report—Written Opinion; International Application No. PCT/US2011/029304; International Filing Date: Mar. 22, 2011; Date of Mailing: May 20, 2011.

International Search Report; International Application No. PCT/US11/49501; International Filing Date: Aug. 29, 2011; Date of Mailing: Jan. 18, 2012.

International Search Report Written Opinion; International Application No. PCT/US11/49501; International Filing Date: Aug. 29, 2011; Date of Mailing: Jan. 18, 2012.

G.W. Neudeck, "An Overview of Double-Gate MOSFETs," Proceedings of 15th Biennial University/Government/Industry Microelectronics Symposium. UGIM 2003. New York, NY: IEEE, US, Jun. 30-Jul. 2, 2003., Jun. 30, 2003, pp. 214-217.

International Search Report; International Application No. PCT/EP2010/066961; International Filing Date: Nov. 8, 2010; Date of Mailing: Feb. 10, 2011.

International Search Report; International Application No. PCT/EP2010/066483; International Filing Date: Oct. 29, 2010; Date of Mailing: Feb. 7, 2011.

International Search Report—Written Opinion; International Application No. PCT/EP2010/066483; International Filing Date: Oct. 29, 2010; Date of Mailing: Feb. 7, 2011.

International Search Report—Written Opinion; International Application No. PCT/EP2010/066961; International Filing Date: Nov. 8, 2010; Date of Mailing: Feb. 10, 2011.

Pavanello et al., "Evaluation of Triple-Gate FinFETs With SiO2-HfO2-TiN Gate Stack Under Analog Operation," Solid State Electronics, Elsevier Science Publishers, Barking, GB, vol. 51, No. 2, Mar. 7, 2007, pp. 285-291.

Checka, N. 'Circuit Architecture for 3D Integration', Chapter 13 in Wafer Level 3-D ICs Process Technology, ed. C.S. Tan, Springer US, 2008, ISBN 978-0-387-76534-1.

Chen et al., "An Integrated Logic Circuit Assembled ona Single Carbon Nanotube", www.sciencemag.org Science, vol. 311, Mar. 24, 2006, p. 1735.

Derycke, et al, "Carbon Nanotube Inter- and Intramolecular Logic Gates" Nano Letters, Sep. 2001, vol. 1, No. 9, pp. 453-456.

Office Action—Non-Final for U.S. Appl. No. 12/684,280, filed Jan. 8, 2010; First Named Inventor: Sarunya Bangsaruntip; Mailing Date: May 2, 2011.

Office Action—Non-Final for U.S. Appl. No. 12/856,718, filed Aug. 16, 2010; first Named Inventor Sarunya Bangsaruntip; Mailing Date: Jul. 9, 2012.

Office Action—Non-Final for U.S. Appl. No. 12/776,485, filed May 10, 2010; Fist Named Inventor: Sarunya Bangsaruntip; Mailing Date: Feb. 21, 2012.

Office Action—Non-Final for U.S. Appl. No. 13/372,719, filed Feb. 14, 2012; First Named Inventor: Sarunya Bangsaruntip; Mailing Date: May 7, 2012.

Office Action—Restriction Electron for U.S. Appl. No. 12/684,280, filed Jan. 8, 2010; First Named Inventor: Sarunya Bangsaruntip; Mailing Date: Feb. 10, 2011.

Restriction/Election Office Action for U.S. Appl. No. 12/758,939, filed Apr. 13, 2010; First Named Inventor: Sarunya Bangsaruntip; Mailing Date: Jun. 8, 2012.

Office Action—Restriction Election for U.S. Appl. No. 12/776,485, filed May 10, 2010; First Named Inventor : Sarunya Bangsaruntip; Mailing Date: Dec. 9, 2011.

Office Action—Final for U.S. Appl. No. 12/684,280, filed Jan. 8, 2010; First Names Inventor: Sarunya Bangsaruntip; Mailing Date: Oct. 5, 2011.

Notice of Allowance for U.S. Appl. No. 12/776,485, filed May 10, 2010; First Named Inventor: Sarunya Bangsaruntip; Mailing Date: Sep. 26, 2012.

Office Action—Final for U.S. Appl. No. 13/372,719, filed Feb. 14, 2012; First Named Inventor: Sarunya Bangsaruntip; Mailing Date: Sep. 4, 2012.

Office Action—Non-Final for U.S. Appl. No. 12/631,199, filed Dec. 4, 2009; First Named Inventor: Sarunya Bangsaruntip; Mailing Date: Jun. 13, 2012.

Office Action—Non-Final for U.S. Appl. No. 12/856,718, filed Aug. 16, 2010; First Named Inventor: Sarunya Bangsaruntip; Mailing Date: Jul. 9, 2012.

Office Action—Restriction-Election for U.S. Appl. No. 12/856,718, filed Aug. 16, 2010; First Named Inventor: Sarunya Bangsaruntip; Mailing Date: Apr. 9, 2012.

Transmittal and International Preliminary Report on Patentability for International Application No. PCT/US2011/029304; International Filing Date: Mar. 22, 2011; date of mailing Oct. 26, 2012, 2 pages.

International Search Report; International Application No. PCT/EP2011/053174; International Filing Date: Mar. 3, 2011; Date of Mailing: May 31, 2011.

International Search Report—Written Opinion; International Application No. PCT/EP2011/053174; International Filing Date: Mar. 3, 2011; Date of Mailing: May 31, 2011.

Written Opinion for International Application No. PCT/US2011/029304; International Filing Date: Mar. 22, 2011; mailing date: May 20, 2011; 5 pages.

* cited by examiner

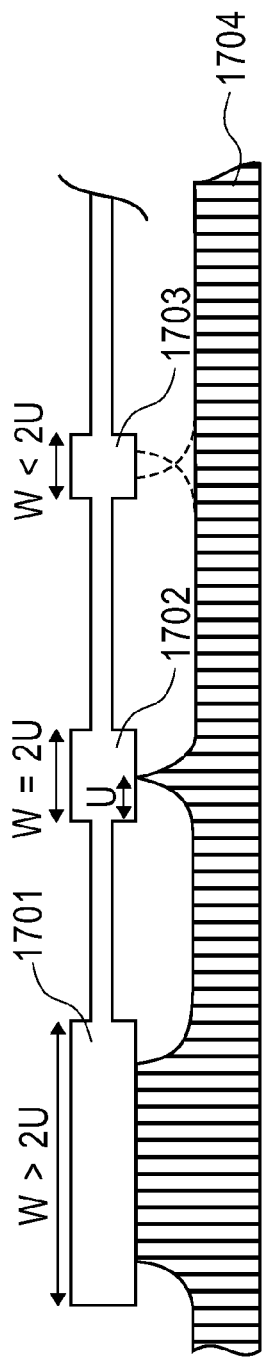
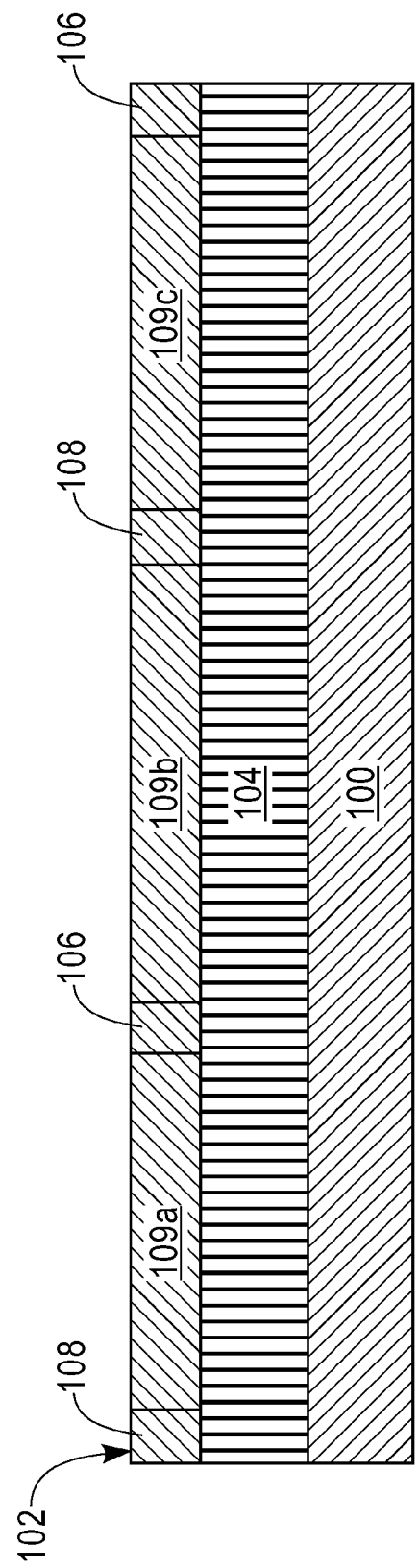
FIG. 1A
FIG. 1B

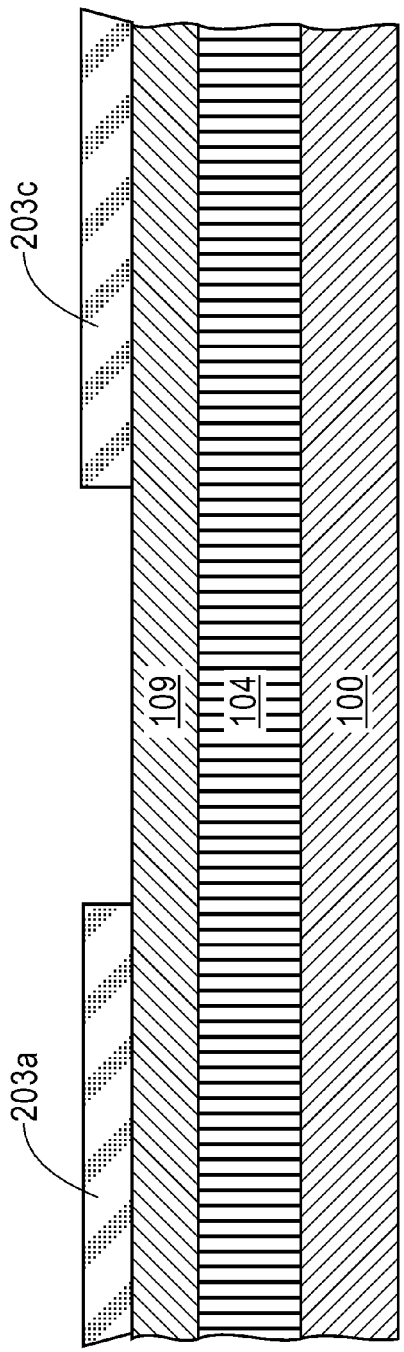
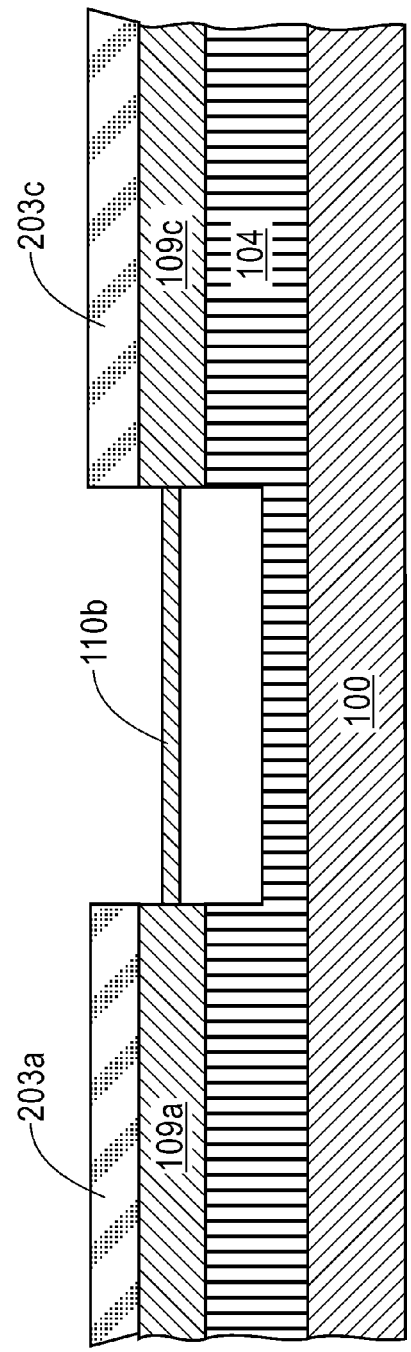
FIG. 10
FIG. 11

NANOWIRE FIELD EFFECT TRANSISTORS

FIELD OF INVENTION

The present invention relates to semiconductor nanowire field effect transistors.

DESCRIPTION OF RELATED ART

A nanowire field effect transistor (FET) includes the nanowire channel region surrounded by a gate material. The nanowire channel region is contacted by doped portions of said nanowire that serve as source and drain regions of the device. Previous fabrication methods used silicon on insulator (SOI) pads to keep the nanowires suspended above a buried oxide (BOX) layer to allow the gate to be formed on all sides of the nanowire, resulting in gate-all-around transistors. The pads may consume valuable space on a silicon wafer.

BRIEF SUMMARY

In one aspect of the present invention, a method for forming a nanowire field effect transistor (FET) device includes forming a first silicon on insulator (SOI) pad region, a second SOI pad region, a third SOI pad region, a first SOI portion connecting the first SOI pad region to the second SOI pad region, and a second SOI portion connecting the second SOI pad region to the third SOI pad region on a semiconductor substrate, patterning a first hardmask layer over the second SOI portion, forming, from the first SOI portion, a first suspended nanowire over the semiconductor substrate, forming a first gate structure around a portion of the first suspended nanowire, patterning a second hardmask layer over the first gate structure and the first suspended nanowire, removing the first hardmask layer, forming, from the second SOI portion, a second suspended nanowire over the semiconductor substrate, forming a second gate structure around a portion of the second suspended nanowire, and removing the second hardmask layer.

In another aspect of the present invention, a method for forming a nanowire field effect transistor (FET) device includes forming a raised silicon on insulator (SOI) region on a semiconductor substrate, patterning a first hardmask layer over a first portion of the SOI region and a second portion of the SOI region, forming from an exposed portion of the SOI region, a first suspended nanowire over the semiconductor substrate, forming a first gate structure around a portion of the first suspended nanowire, patterning a second hardmask layer over the first gate structure and the first suspended nanowire, removing the first hardmask layer to expose the first and second portions of the SOI region, forming, from the exposed first SOI portion, a second suspended nanowire over the semiconductor substrate and from the exposed second SOI portion, a third suspended nanowire over the semiconductor substrate, forming a second gate structure around a portion of the second suspended nanowire and a third gate structure around a portion of the third suspended nanowire, and removing the second hardmask layer.

In yet another aspect of the present invention, a nanowire field effect transistor (FET) device includes a silicon nanowire having a first channel region surrounded by a first gate structure disposed circumferentially around the silicon nanowire and a second channel region surrounded by a second gate structure disposed circumferentially around the silicon nanowire, wherein the silicon nanowire is suspended above a semiconductor substrate by a first capping portion disposed on the first gate structure and a second capping portion disposed on the second gate structure.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1A-8 illustrate an exemplary method for forming nanowire FET devices. In this regard:

FIG. 1A illustrates a cross-sectional view of an example of a relationship between the width of SOI pad regions and the width of undercut regions from an exemplary etching process.

FIG. 1B illustrates the formation of a SOI layer;
FIG. 2 illustrates the formation of nanowires;
FIG. 4 illustrates the formation of a nanowire;
FIG. 5 illustrates the formation of gates;
FIG. 6 illustrates the removal of a hardmask layer;
FIG. 7 illustrates the formation of spacers;
and
FIG. 8 illustrates ion implantation.

FIGS. 9A-16 illustrate cross-sectional views of an alternate exemplary method for forming nanowire FET devices. In this regard:

FIG. 9A illustrates the formation of a SOI layer;
FIG. 10 illustrates the formation of a hardmask layer;
FIG. 11 illustrates the formation of a nanowire;
FIG. 12 illustrates the formation of gates;
FIG. 13 illustrates the formation of nanowire;
FIG. 14 illustrates the formation of gates;
FIG. 15 illustrates the formation of spacers;
and
FIG. 16 illustrates ion implantation.

DETAILED DESCRIPTION

Figure 1C:
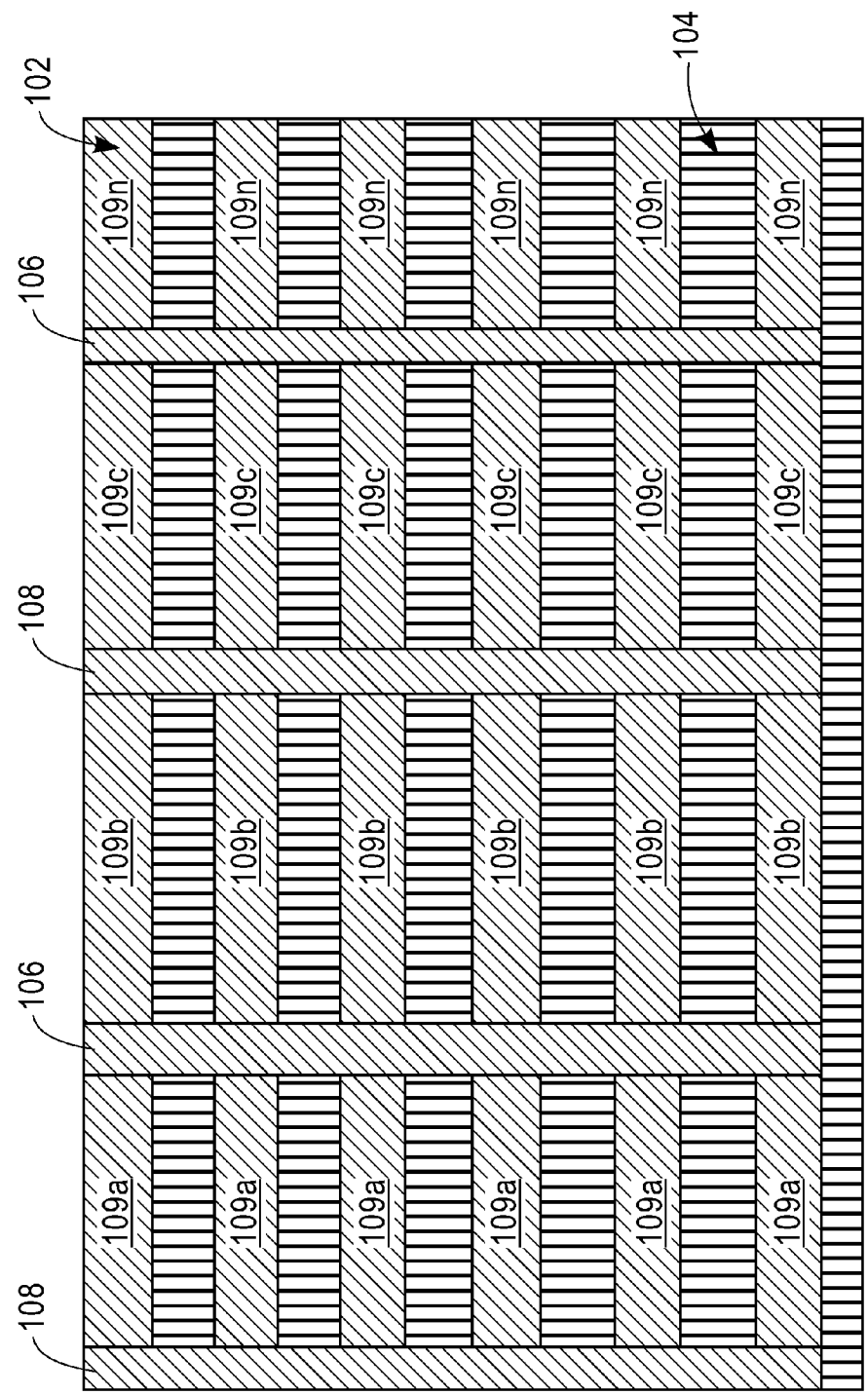
FIG. 1C illustrates a top view of the SOI layer of FIG. 1B.

Previous fabrication methods limit the number of gate-all-around FET devices that may be formed over suspended nanowire sections. This is due to the finite length of suspended nanowires, as a long section of suspended nanowire may sag and contact an buried oxide layer of the device, preventing formation of gate-all-around structures.

Silicon on insulator (SOI) pads with sufficient width may be used to keep sections of the nanowires suspended above the BOX layer (FIG. 1A). However, as device pitch continue to decrease, the pad width (W) could become so narrow that the undercut width in the BOX layer (U), used to fully suspend the nanowire, could cause the pad to loose physical support and thus, no longer suspend the nanowires. While the pads are used, if a hydrogen annealing process is to be used to smooth the nanowires, the pads may consume valuable space on a silicon wafer.

FIG. 1A illustrates an example of a relationship between the width of SOI pad regions 1701, 1702 and 1703 having different widths (W). In this regard, the etching and removal of the BOX layer 104 material is operative to result in an undercut regions having a length (U). The resultant structure results in SOI pad region 1701 having a width greater than 2 U remaining supported by the BOX layer 1704. The SOI pad region 1702 having a width equal to 2 U is partially supported by the BOX layer 1704. The SOI pad region 1703 having a width less than 2 U is detached from the BOX layer 1704.

FIGS. 1B-8 illustrate cross-sectional views of an exemplary method for forming nanowire FET devices.

With reference now to FIG. 1B, a cross-sectional view is shown of a silicon on insulator (SOI) portion 102 is defined on a buried oxide (BOX) layer 104 that is disposed on a silicon substrate 100. The SOI portion 102 includes SOI pad regions 106, SOI pad regions 108, and nanowire portions 109a-c. The SOI portion 102 may be patterned by the use of lithography followed by an etching process such as, for example, reactive ion etching (RIE).

FIG. 1C illustrates a top-down view of the SOI portion 102 that illustrates an example of the arrangement of the nanowire portions 109a-n. As illustrated, the SOI portion 102 may include any number (n) of nanowire portions 109.

Figure 2:
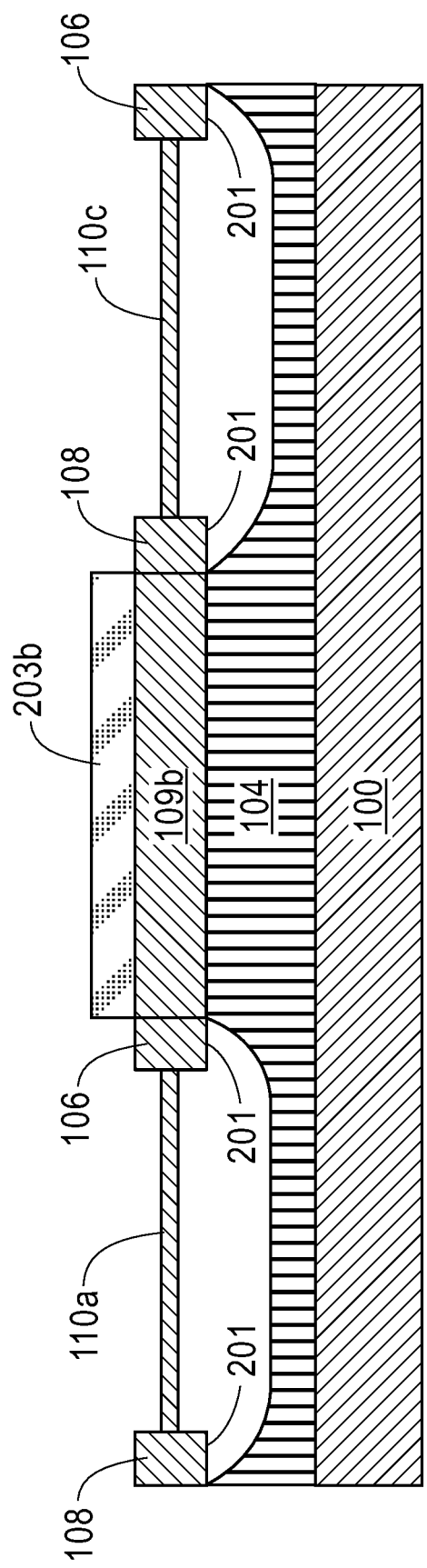

FIG. 2 illustrates the resultant structure following the deposition and patterning by lithography and etching of a hardmask layer 203b over the nanowire portion 109b. The hardmask layer 203b may be formed from, for example, a nitride and/or oxide material. Once the hardmask layer 203b is formed, portions of the BOX layer 104 that are not protected by the hardmask layer 203b are removed with an isotropic etching process. The BOX layer 104 is recessed in regions not covered by SOI portion 102. The isotropic etching results in the lateral etching of portions of the BOX layer 104 that are under the SOI portion 102. The lateral etch suspends the nanowires 109a and 109c above the BOX layer 104. The length of the suspended nanowire 109a and 109c may be chosen to limit the nanowire 109a and 109c from sagging and touching the BOX layer 104. The lateral etch may form undercuts 201 in the BOX layer 104 and overhang portions at the edges of SOI regions 106 and 108. The isotropic etching of the BOX layer 104 may be, for example, performed using a diluted hydrofluoric acid (DHF). A 100:1 DHF etches about 2 to 3 nm of BOX layer 104 per minute at room temperature. Following the isotropic etching the nanowires portions 109a and 109c may be smoothed to reduce the line edge roughness. This process may result in elliptical shaped (and in some cases, cylindrical shaped) nanowires 110a and 110c that are suspended above the BOX layer 104 by the SOI pad regions 106 and the SOI pad regions 108. The smoothing of the nanowires may be performed by, for example, annealing of the nanowires 109a and 109c in hydrogen. Example annealing temperatures may be in the range of 600° C.-900° C., and a hydrogen pressure of approximately 7 torr to 600 torr.

A thinning process may be performed on the nanowires 110a and 110c to reduce the diameter of the nanowires 110a and 110c. The reduction of the diameter of the nanowires 110a and 110c may be performed by, for example, an oxidation of the nanowires 110a and 110c followed by the etching of the grown oxide. The oxidation and etching process may be repeated to achieve a desired nanowire 110a and 110c diameter. Once the diameters of the nanowires 110a and 110c have been reduced, gates are formed over the channel regions of the nanowires 110a and 110c (described below).

Figure 3A:
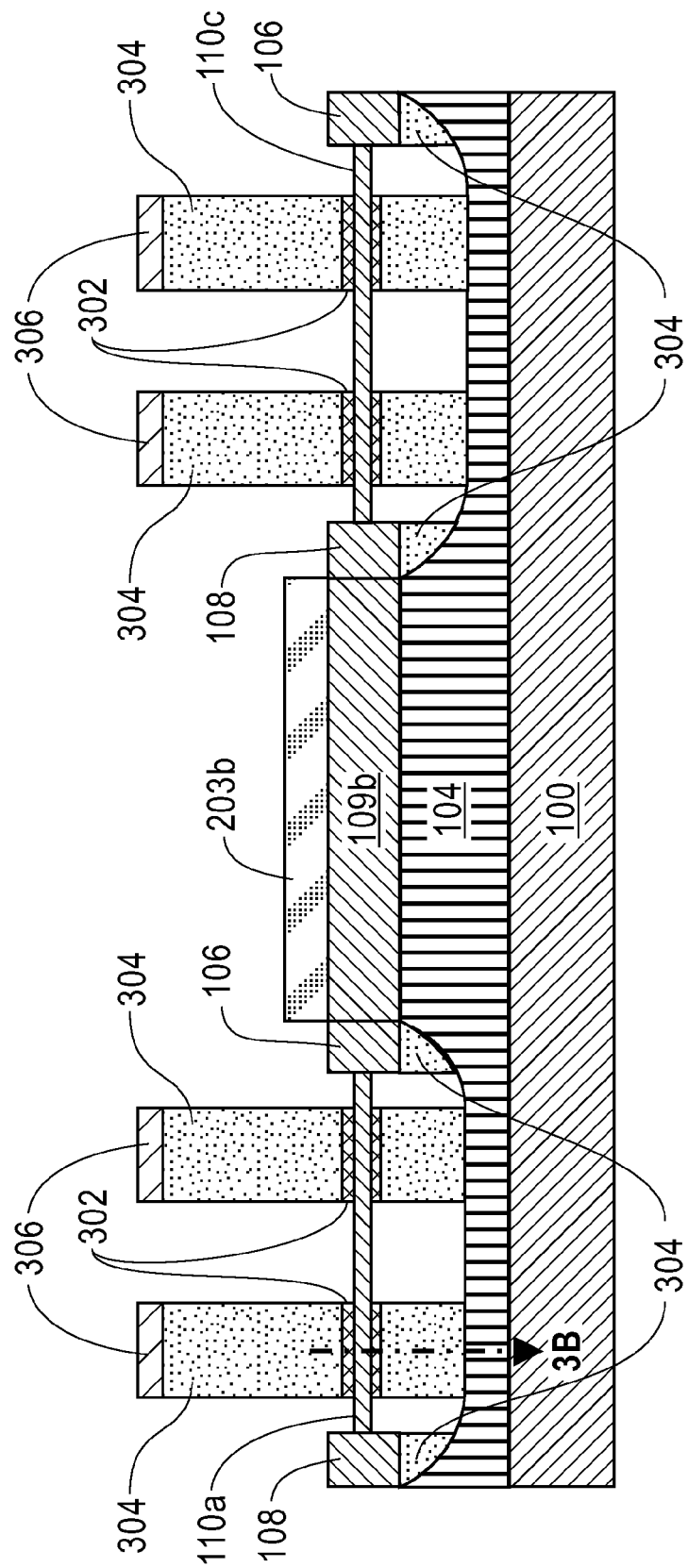
FIG. 3A illustrates the formation of gates.

FIG. 3A illustrates gates 302 that are formed around portions of the nanowires 110a and 110c, as described in further detail below, and capped with a polysilicon layer (capping layer) 304. A hardmask layer 306, such as, for example silicon nitride ($Si_3N_4$) is deposited over the polysilicon layer 304. The polysilicon layer 304 and the hardmask layer 306 may be formed by depositing polysilicon material over the BOX layer 104 and the SOI portion 102, depositing the hardmask material over the polysilicon material, patterning by lithography and etching by RIE to form the polysilicon layer 304 and the hardmask layer 306 illustrated in FIG. 3A. Portions of the polysilicon layer 304 are formed under the SOI pad regions 106 and 108 in the undercut regions 201 (of FIG. 2). The polysilicon layer 304 partially supports portions of the SOI pad regions 106 and 108.

The etching of the gates 302 may be performed by directional etching that results in straight sidewalls of the gate 302. Following the directional etching, polysilicon 304 remains under portions of the nanowires 110a and 110c that are outside the region encapsulated by the gates 302. Isotropic etching may be performed to remove polysilicon 304 from under the nanowires 110a and 110c.

Figure 3B:
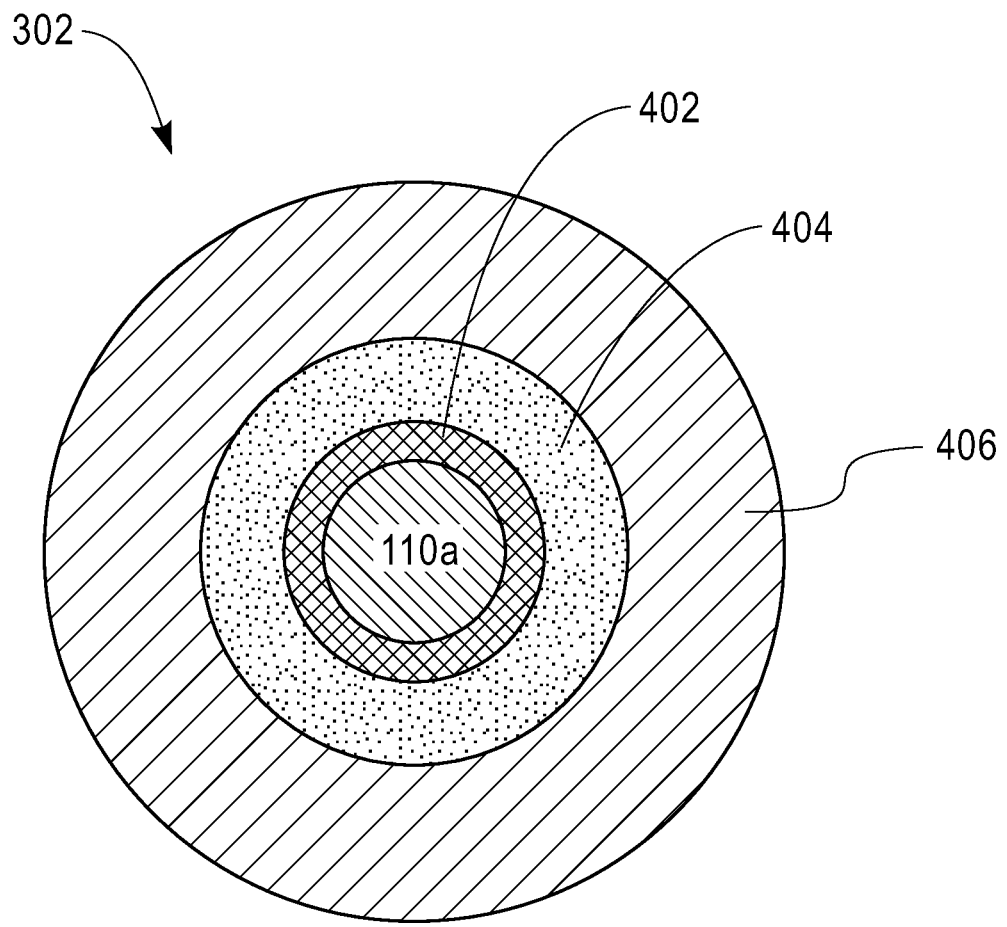
FIG. 3B illustrates a cross-sectional view of a gate along the line 3B of FIG. 3A.

FIG. 3B illustrates a cross sectional view of a gate 302 along the line 3B (of FIG. 3A). The gate 302 is created by forming a first gate dielectric layer 402, such as silicon dioxide ($SiO_2$) fully surrounding a channel portion of the nanowire 110a. A second gate dielectric layer 404 such as, for example, hafnium oxide ($HfO_2$) is formed around the first gate dielectric layer 402. A metal layer 406 such as, for example, tantalum nitride (TaN) or titanium nitride (TiN) is formed around the second gate dielectric layer 404. The metal layer 406 is surrounded by polysilicon layer 304 (of FIG. 3A). Doping the polysilicon layer 304, which may occur before or after gate patterning, with impurities such as boron (p-type), or phosphorus (n-type) makes the polysilicon layer 304 conductive. Following the polysilicon 304 patterning described above, portions of the metal layer around the nanowire 110a outside the encapsulated gate region(s) 302 are removed by an isotropic etching process. This process may be carried out by, for example, an isotropic chemical etch or a RIE process that has a significant lateral etch component.

Alternatively, full metal gates may be formed on the nanowires 110a and 110c. A metal gate may include a combination of metal layers such as tantalum, titanium aluminum nitride, aluminum, and titanium nitride. These metal layers are deposited around the nanowire 110a after the dielectric formation, and are patterned by lithography and etching in a similar fashion as described above. The metal layers result in a similar structure as described above, however, the regions filled with the polysilicon 304 material are filled with a metallic gate material.

Alternatively, the gate stack 302 and 304 may form a dummy gate, composed of replaceable materials such as polysilicon or oxide, which can be later replaced with an alternative gate stack.

Figure 4:
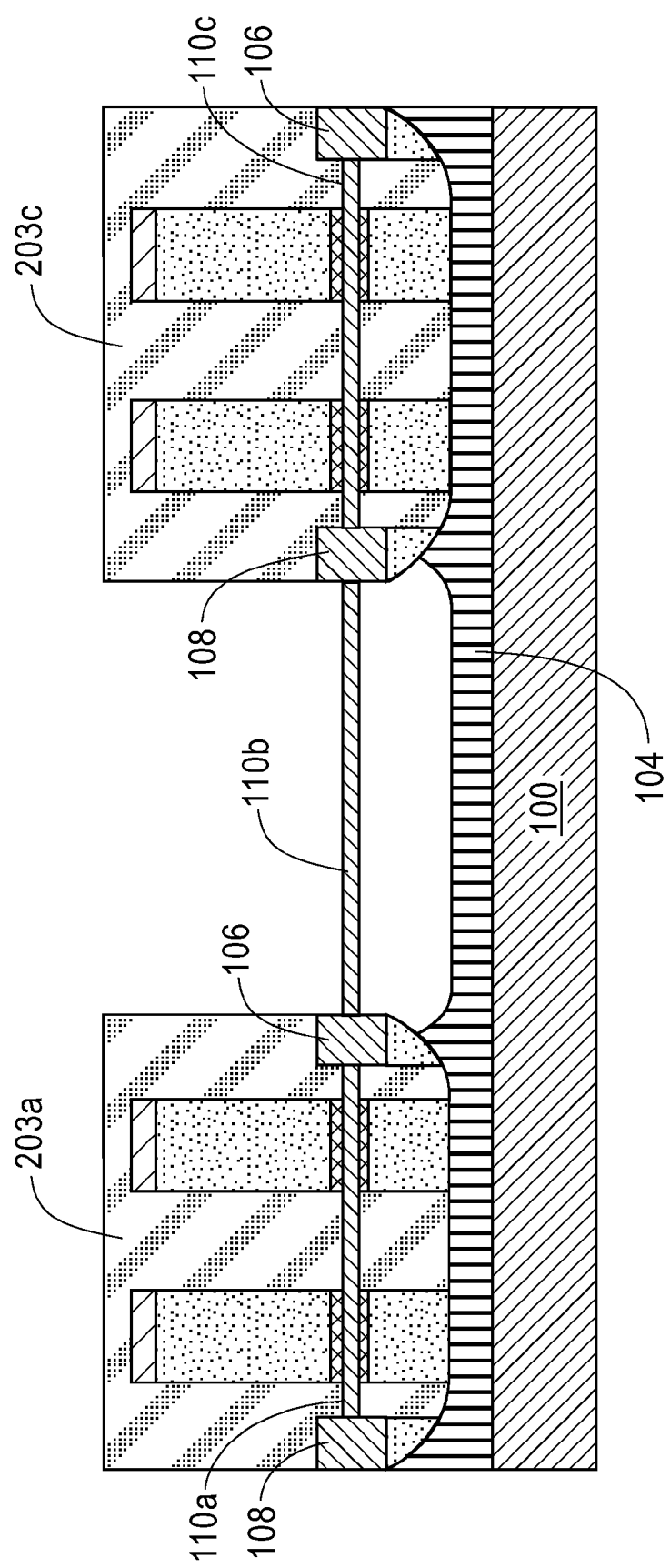

FIG. 4 illustrates the resultant structure where hardmask layers 203a and 203c are formed over the polysilicon layers 304, the hardmasks 306, the nanowires 110a and 110c, and the SOI pad regions 106 and 108 using a similar method as described above to form the hardmask layer 203b (of FIG. 2). Alternatively, spacers with sufficient thickness may be formed on the sidewalls of polysilicon 304 and hardmask 302 to cover the pads 106 and 108. This spacer can be formed by a blanket deposition of dielectric film such as silicon nitride and etching the dielectric film from all horizontal surfaces by RIE. This method affords a self-aligned process in masking the region.

The hardmask layer 203b is selectively removed, and the nanowire 110b is formed from the nanowire portion 109b using a similar process as described above to form the nanowires 110a and 110c.

Figure 5:
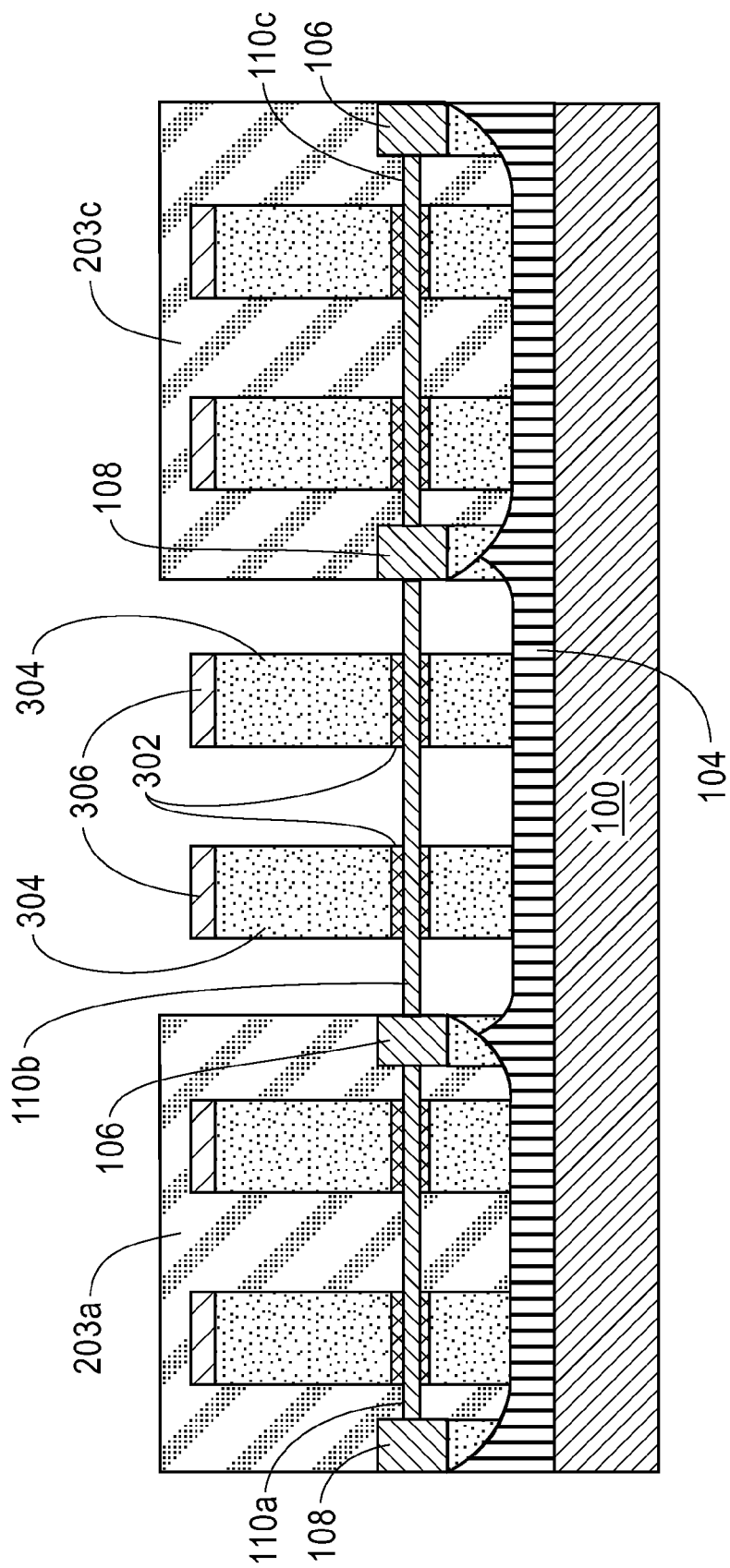

Referring to FIG. 5, gates 302, capping layer 304, and hardmask 306 are formed on the nanowire 110b using similar methods as described above, though composition of the individual gate stack layers may vary. The formation of the capping layer 304 results in undercut regions below the SOI pad regions 106 and 108 being filled with the capping layer 304 material resulting in the SOI pad regions 106 and 108 being partially supported by the capping layer material 304.

Figure 6:
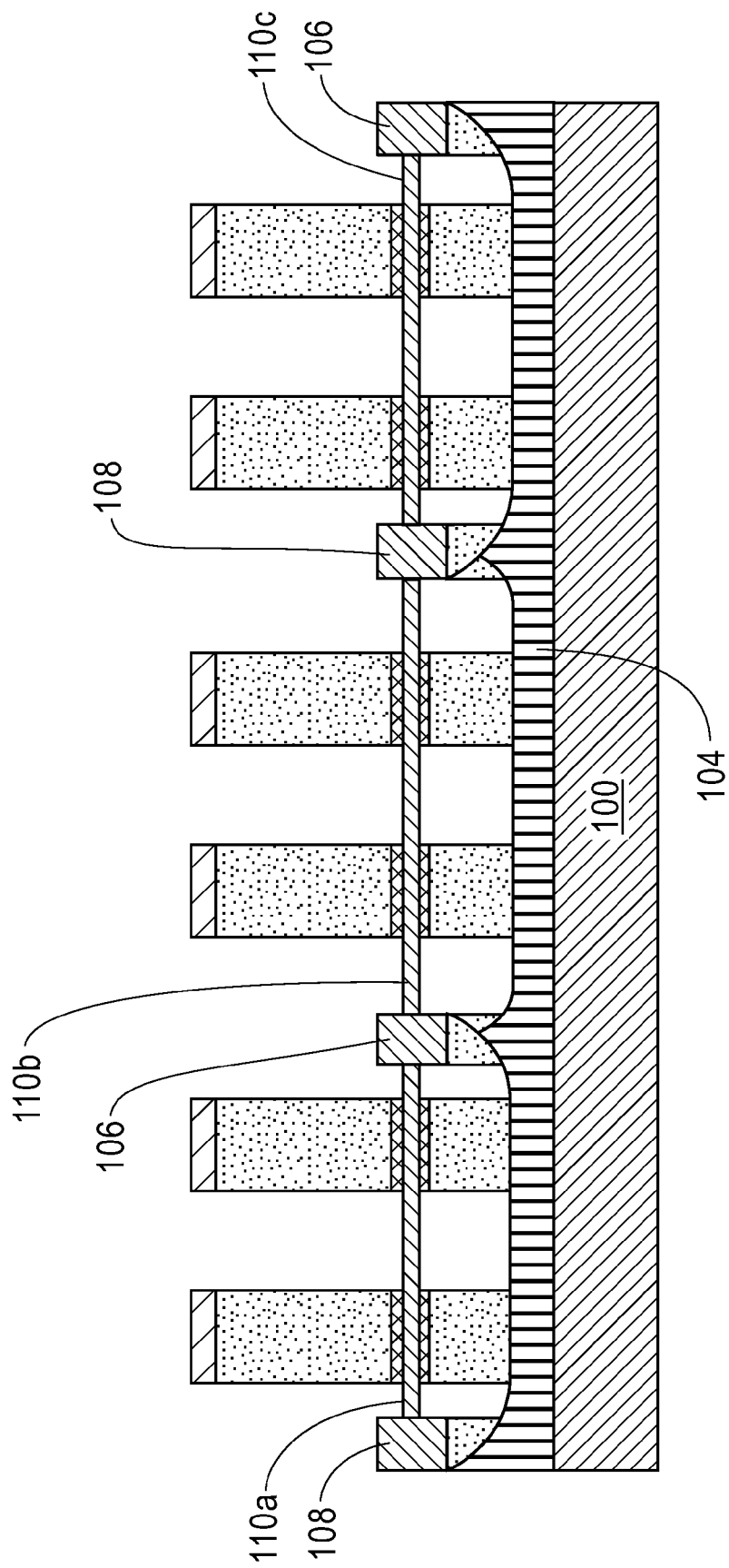

FIG. 6 illustrates the resultant structure following the removal of the hardmask layers 203a and 203c.

Figure 7:
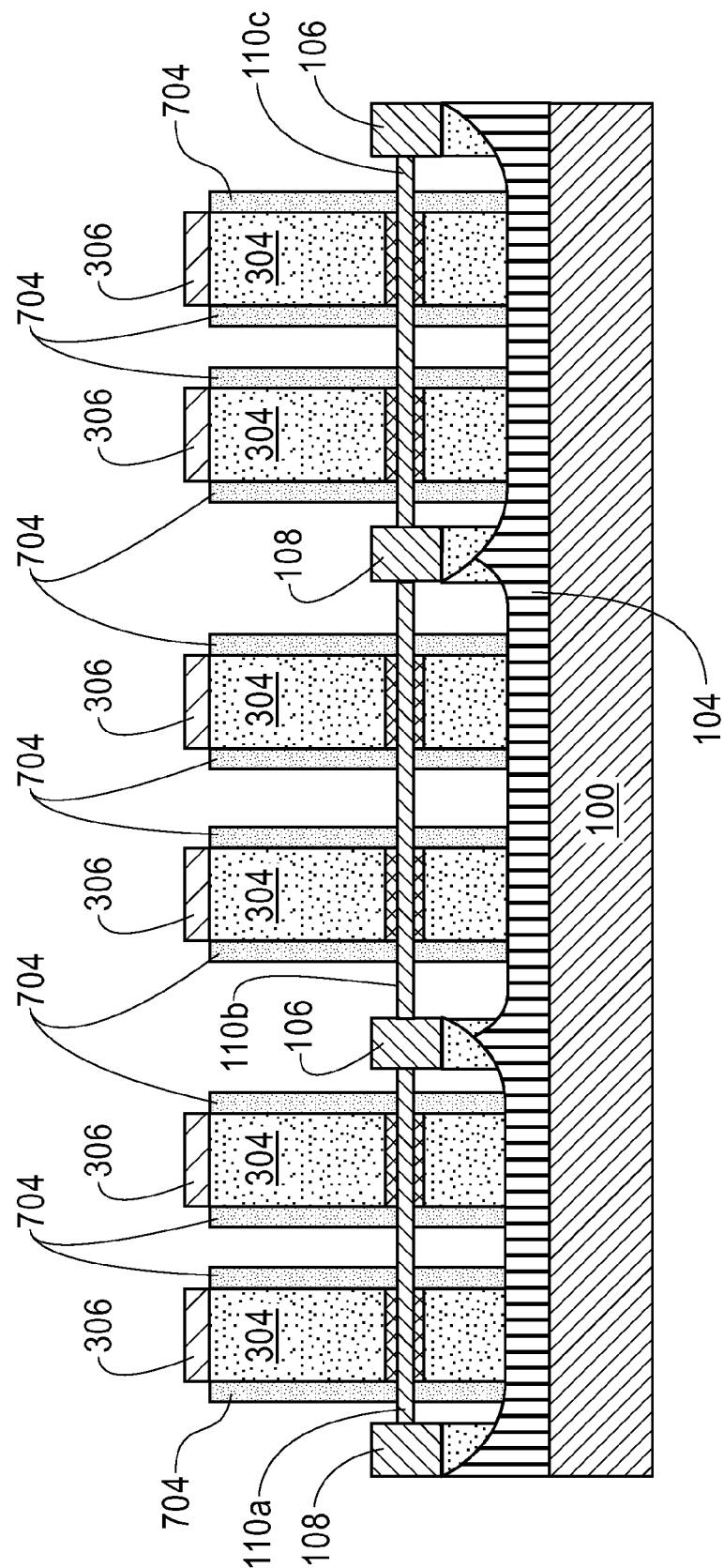

FIG. 7 illustrates spacer portions 704 that may be formed along opposing sides of the polysilicon layer 304. The spacers are formed by depositing a blanket dielectric film such as silicon nitride and etching the dielectric film from all horizontal surfaces by RIE. The spacer walls 704 are formed around portions of the nanowire 110a-c that extend from the polysilicon layer 304 and surround portions of the nanowires 110a-c. Spacer portions (not shown) may be formed under the nanowires 110a-c, and in the undercut regions (not shown) of the SOI pad regions 106 and 108.

At this point, source (S) and drain (D) regions may be defined on the device by a variety of process. For example, the exposed nanowires 110a-c and the SOI pad regions 106 and 108 may be increased in size using an epitaxial silicon growth process, with or without in-situ doping. The source and drain regions may be doped by, for example, exposure to n-type or p-type ions.

Figure 8:
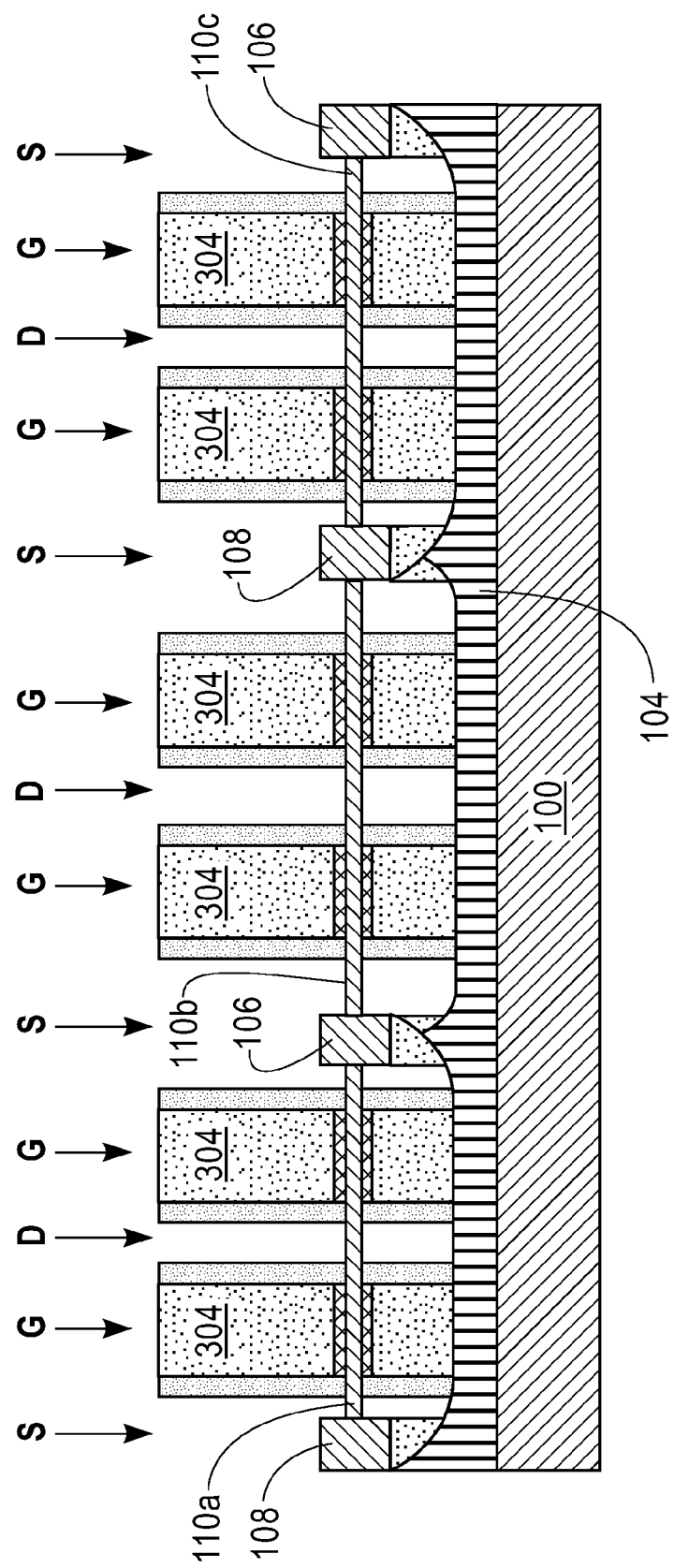

FIG. 8 illustrates the resultant structure following the removal of the hardmasks 306, which exposes the polysilicon layers 304. Following the removal of the hardmasks 306, the gate (G) regions may be defined on the device by a variety of process, for example, doping by exposure to n-type or p-type ions.

Alternatively, following the removal of the hardmasks 306, the source (S) drain (D), and gate (G) regions may be defined on the device simultaneously by a variety of process, for example, doping by exposure to n-type or p-type ions.

A silicide may be formed in the source, gate, and drain regions, and conductive contacts may be formed to contact the regions by any suitable process.

FIGS. 9A-16 illustrate cross-sectional views of an alternate exemplary method for forming a nanowire FET. The alternate exemplary method is similar to the method described above in FIGS. 1-8.

Figure 9A:
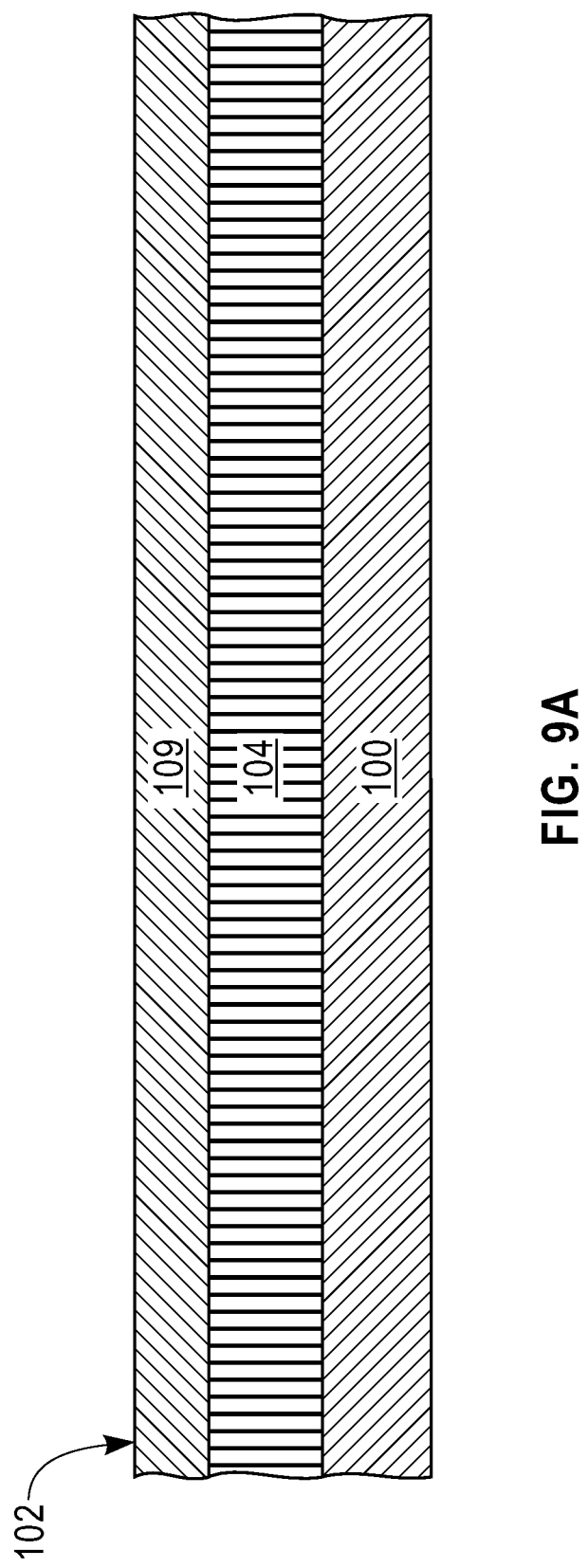

Referring to FIG. 9A, a silicon on insulator (SOI) portion 102 is defined on a buried oxide (BOX) layer 104 that is disposed on a silicon substrate 100. The SOI portion 102 includes a nanowire portion 109. The SOI portion 102 may be patterned by the use of lithography followed by an etching process such as, for example, reactive ion etching (RIE).

Figure 9B:
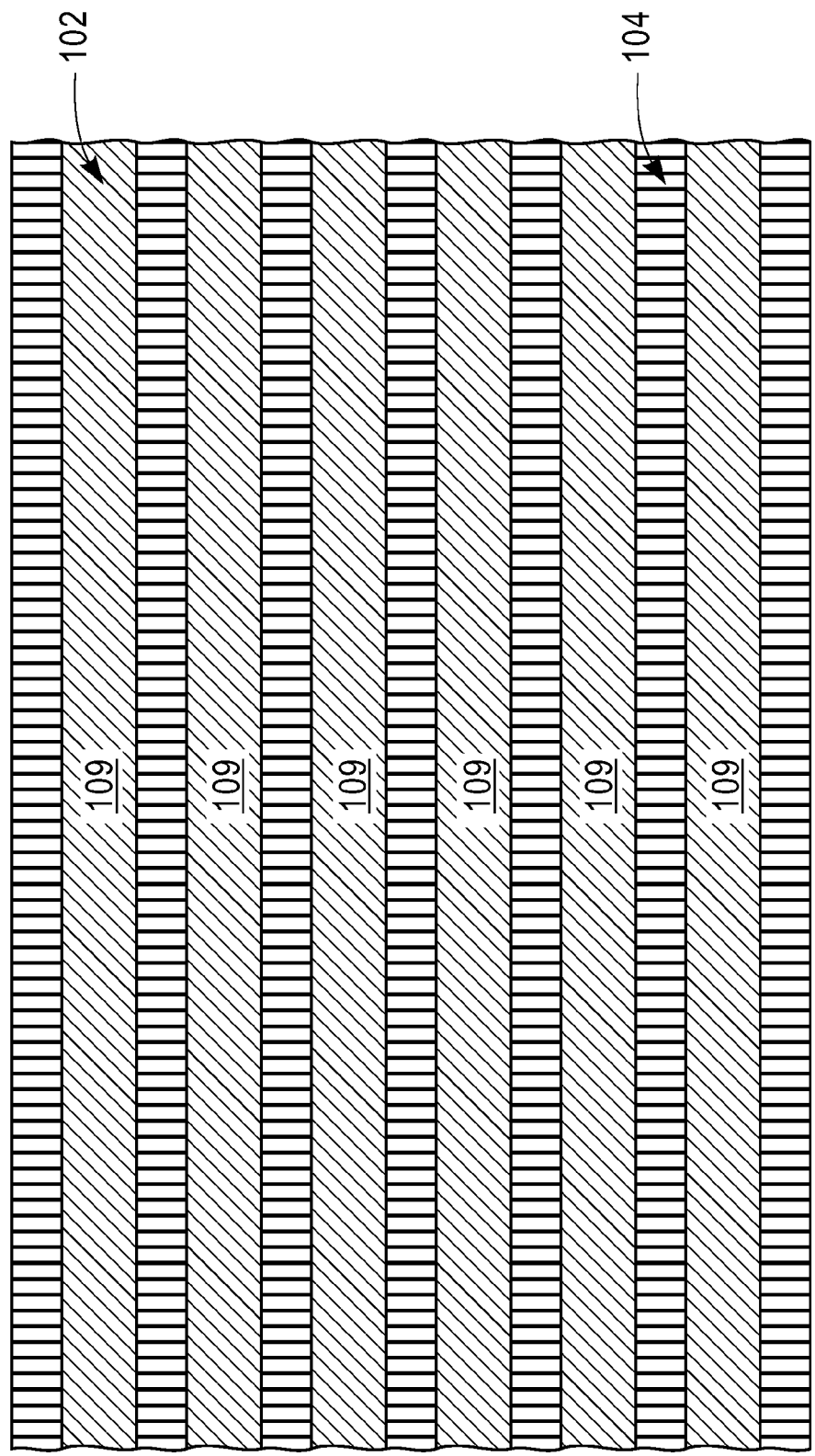
FIG. 9B illustrates a top view of the formation of the SOI layer.

FIG. 9B illustrates a top-down view of the SOI portion 102 that illustrates an example of the arrangement of the nanowire portion 109.

FIG. 10 illustrates the resultant structure following the patterning and deposition of hardmask layers 203a and 203c over the nanowire portion 109. The hardmask layers 203a and 203c are formed in a similar manner to the hardmask layers 203 described above.

FIG. 11 illustrates the resultant structure following an isotropic etching process similar to the process described above to remove portions of the nanowire portion 109 to form a nanowire 110b and to define the nanowire portions 109a and 109c that are protected from the etching process by the hardmask layers 203a and 203c. The nanowire 110b is suspended above the BOX layer 104 by the nanowire portions 109a, 109c and hardmasks 203a and 203c. An oxidation process similar to the process described above may be performed to reduce the size of the nanowire 110b if desired.

Figure 12:
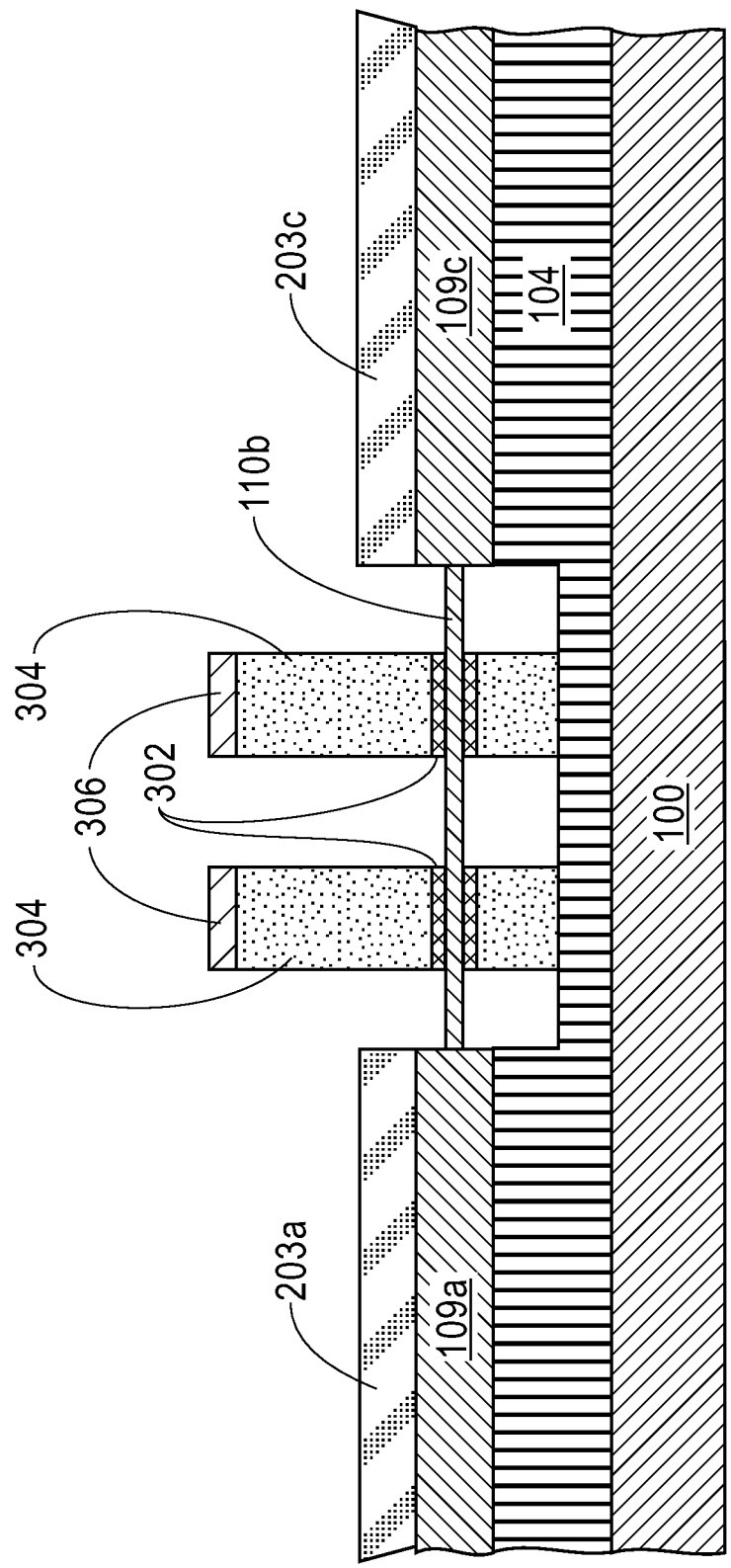

FIG. 12 illustrates the resultant structure following the formation of gates 302 that are around portions of the nanowires 110b, capped with a polysilicon layer (capping layer) 304, and topped with a hardmask layer 306. The gate is patterned using a similar method as described above.

Figure 13:
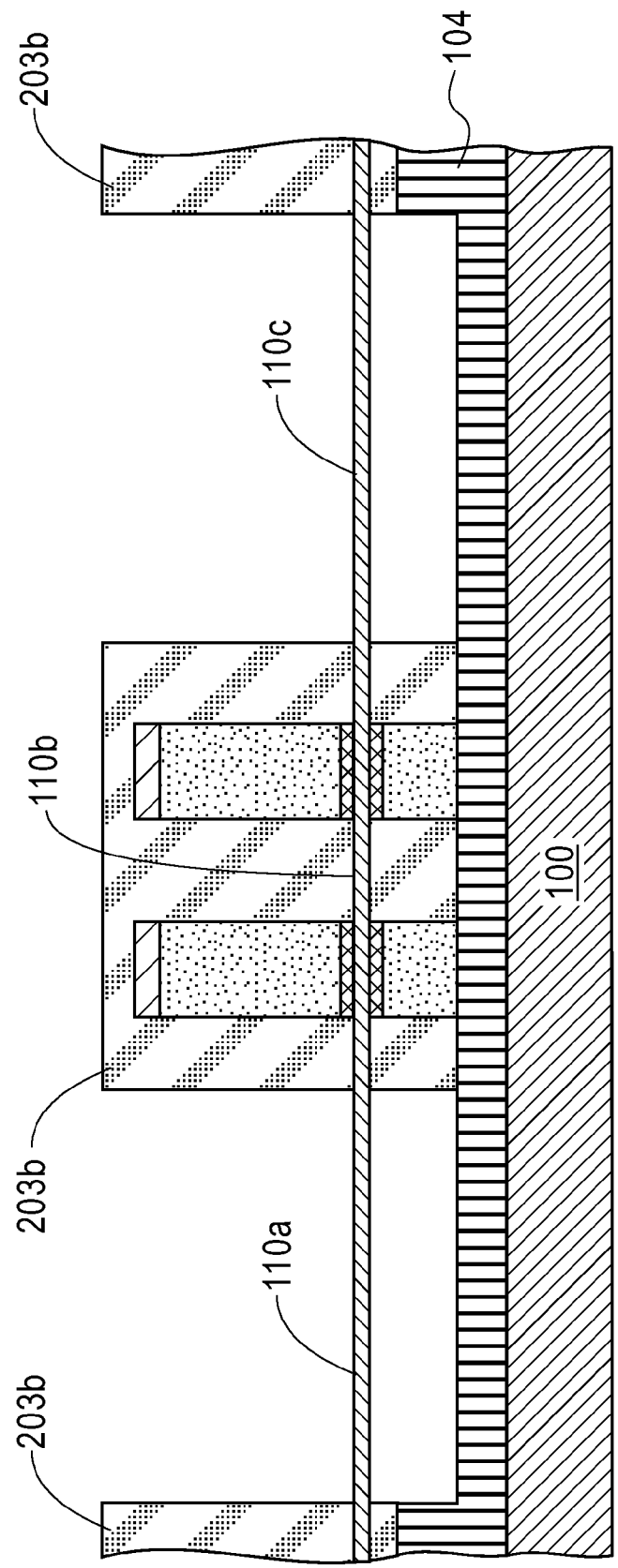

Referring to FIG. 13, hardmasks 203b have been deposited over the nanowire 110b, the polysilicon layer 304 and the hardmask layer 306. The hardmask layers 203a and 203c have been removed, and the nanowires 110a and 110c are suspended by the hardmasks 203b. An oxidation process similar to the process described above may be performed to reduce the size of the nanowire 110a and 110c if desired.

Figure 14:
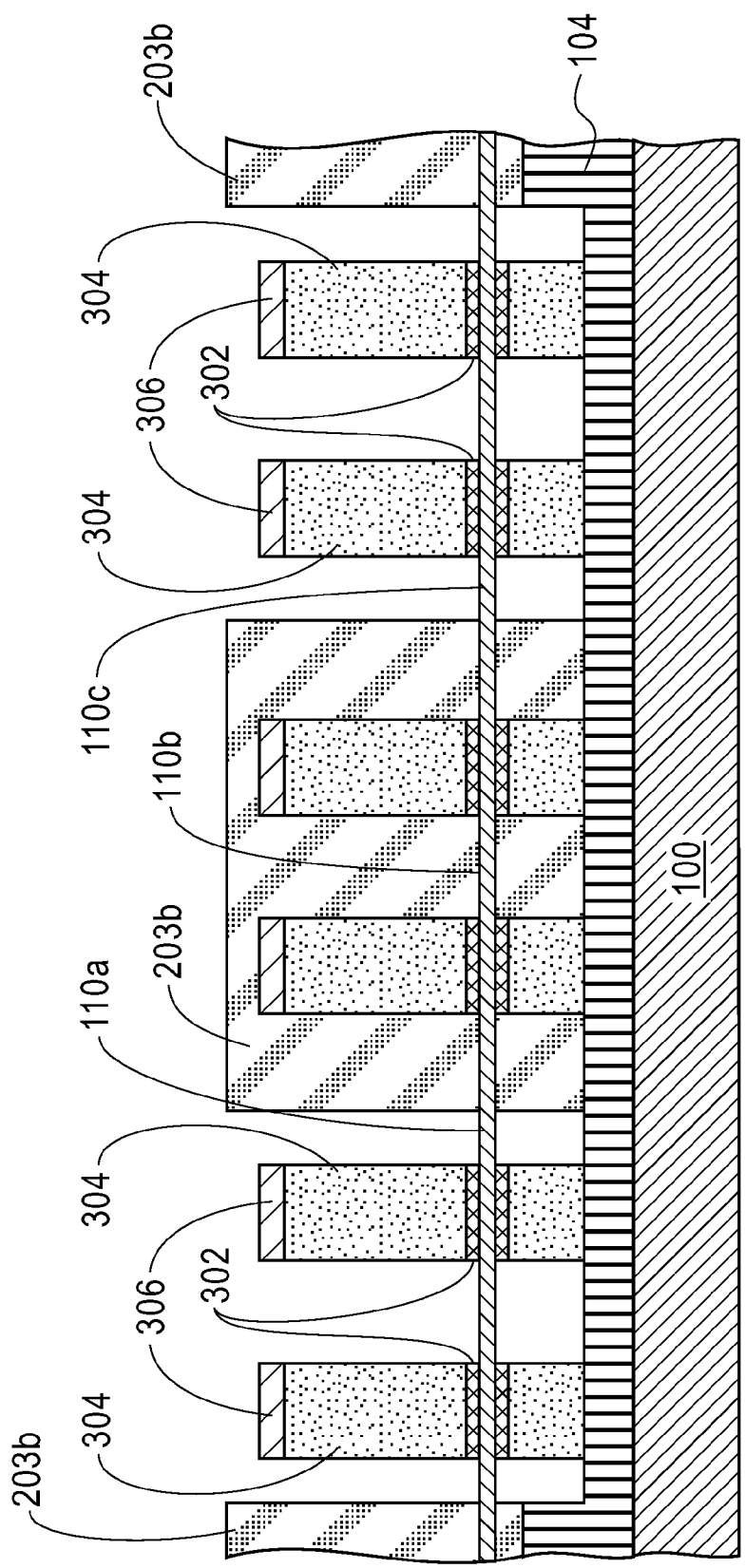

FIG. 14 illustrates the formed gates 302, polysilicon layers 304, and hardmask layers 306 that are formed on the nanowires 110a and 110c using a similar method as described above.

Figure 15:
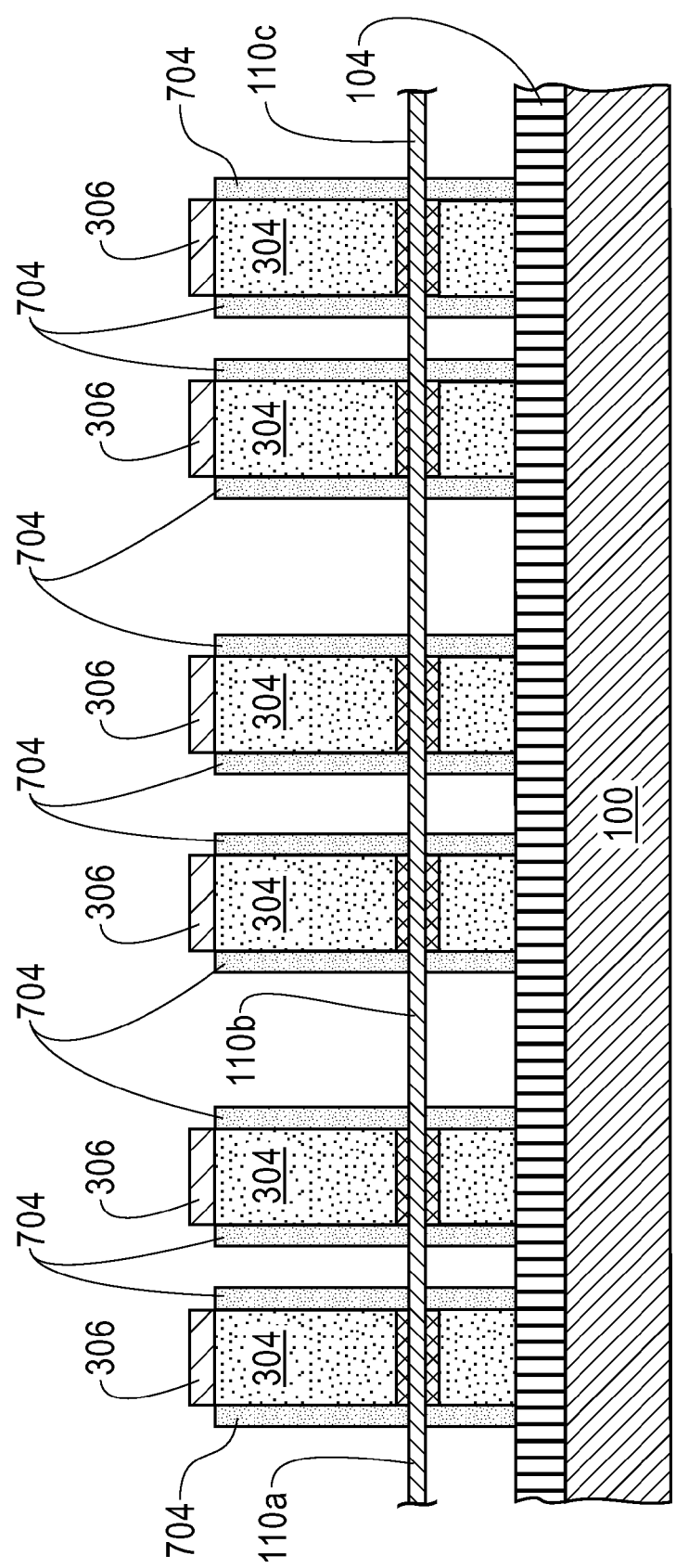

FIG. 15 illustrates spacer portions 704 that may be formed along opposing sides of the polysilicon layer 304 using similar methods as described above.

Figure 16:
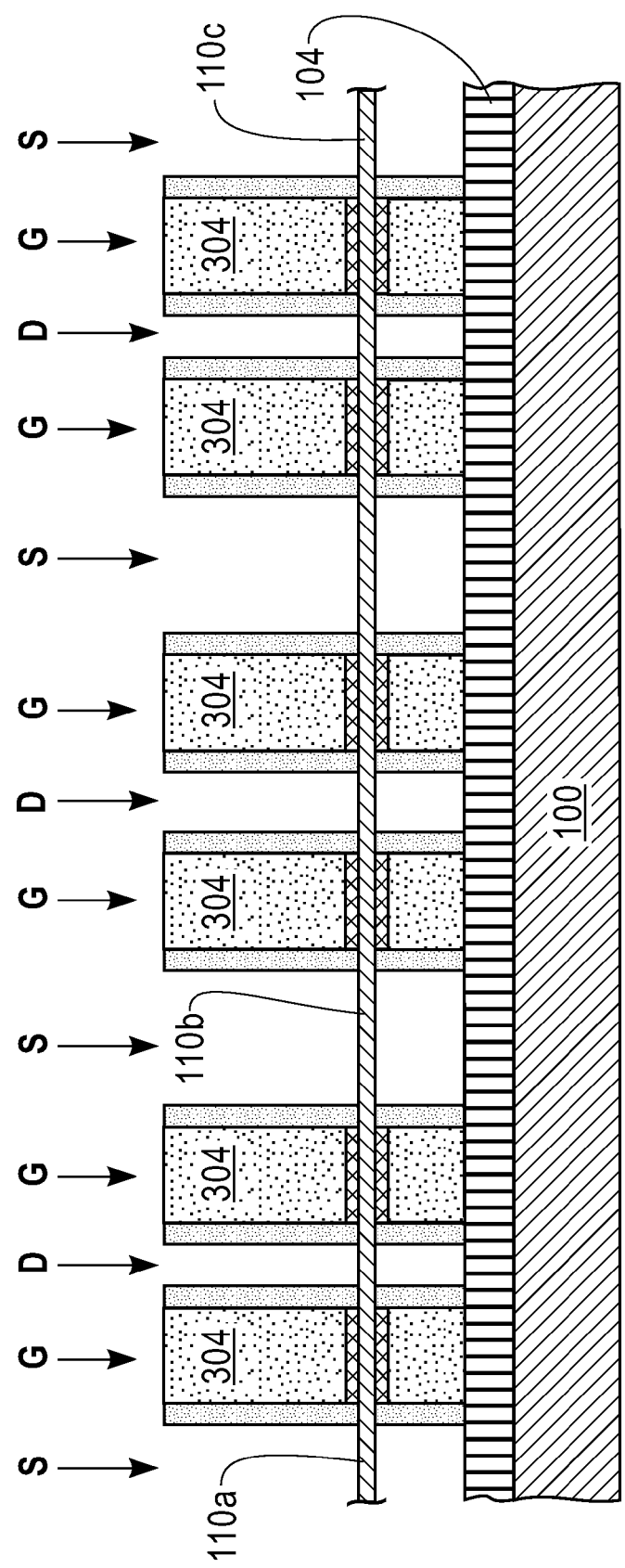

FIG. 16 illustrates the resultant structure following the removal of the hardmasks 306, which exposes the polysilicon layers 304. Following the removal of the hardmasks 306, source (S), drain (D), and gate (G) regions may be defined on the device by a variety of process. For example, the exposed nanowires 110a-c may be increased in size using an epitaxial silicon growth process. The source and drain regions may be doped by, for example, exposure to n-type or p-type ions, and a silicide may be formed in the source, gate, and drain regions, and conductive contacts may be formed to contact the regions by any suitable process.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A nanowire field effect transistor (FET) device including a silicon nanowire having a first channel region surrounded by a first gate structure disposed circumferentially around the silicon nanowire and a second channel region surrounded by a second gate structure disposed circumferentially around the silicon nanowire, wherein the silicon nanowire is suspended above a semiconductor substrate by a first portion of a capping layer disposed on the first gate structure, a second portion of a capping layer disposed on the second gate structure, and a SOI pad region disposed between the first channel region and the second channel region, the SOI pad region being supported by a third portion of the capping layer.

2. The device of claim 1, wherein the first gate structure and the second gate structure of the device each include at least one gate region.

3. The device of claim 2, wherein the first gate structure includes a silicon oxide layer disposed on the gate portion of the nanowire, a dielectric layer disposed on the silicon oxide layer, and a metal layer disposed on the dielectric layer.

* * * * *